(12) United States Patent
Oshio et al.

(10) Patent No.: US 11,407,942 B2
(45) Date of Patent: Aug. 9, 2022

(54) GARNET SILICATE, GARNET SILICATE PHOSPHOR, AND WAVELENGTH CONVERTER AND LIGHT EMITTING DEVICE WHICH USE THE GARNET SILICATE PHOSPHOR

(71) Applicant: Panasonic Intellectual Property Management Co., Ltd., Osaka (JP)

(72) Inventors: Shozo Oshio, Osaka (JP); Takeshi Abe, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 462 days.

(21) Appl. No.: 16/621,204

(22) PCT Filed: May 10, 2018

(86) PCT No.: PCT/JP2018/018117
§ 371 (c)(1),
(2) Date: Dec. 10, 2019

(87) PCT Pub. No.: WO2018/230207
PCT Pub. Date: Dec. 20, 2018

(65) Prior Publication Data
US 2020/0109331 A1 Apr. 9, 2020

(30) Foreign Application Priority Data

Jun. 15, 2017 (JP) .............................. JP2017-117619

(51) Int. Cl.
*C09K 11/77* (2006.01)
*F21V 9/32* (2018.01)
(Continued)

(52) U.S. Cl.
CPC ........ *C09K 11/77742* (2021.01); *C01B 33/24* (2013.01); *C09K 11/77062* (2021.01);
(Continued)

(58) Field of Classification Search
CPC ...... C09K 11/77742; C09K 11/777062; C01B 33/24; C01B 33/20; F21V 9/32; H01L 33/502; H01L 33/504
See application file for complete search history.

(56) References Cited

U.S. PATENT DOCUMENTS 7,442,326 B2 10/2008 Setlur
2003/0015955 A1 1/2003 Shiki
(Continued)

FOREIGN PATENT DOCUMENTS

JP 62-195078 A 8/1987
JP 2009-173905 A 8/2009

OTHER PUBLICATIONS

Hang Lin et al: "Lu 2 CaMg 2(Si 1-x Ge-x) 3 0 12:Ce 3+ solution phosphors: bandgap engineering for blue-;light activated afterglow applicable to AC-LED", Journal of Materials Chemistry C, vol. 4, No. 43.
(Continued)

*Primary Examiner* — C Melissa Koslow
(74) *Attorney, Agent, or Firm* — Renner, Otto, Boisselle & Sklar, LLP (57) ABSTRACT

Garnet silicate is garnet silicate containing, as a main component, silicate represented by a general formula: $Lu_2CaMg_2(SiO_4)_3$. The garnet silicate includes primary particles having a particle shape derived from a crystal structure of garnet. Moreover, the garnet silicate further contains
(Continued)

alkaline metal including at least lithium, in which a content of the alkaline metal is less than 2000 ppm. The garnet silicate phosphor includes garnet silicate and ions which are included in the garnet silicate and function as a light emission center. The wavelength converter includes the garnet silicate phosphor. A light emitting device includes the garnet silicate phosphor or the wavelength converter.

8 Claims, 8 Drawing Sheets

(51) Int. Cl.
    *F21V 9/38*     (2018.01)
    *C01B 33/24*     (2006.01)
    *G03B 21/20*     (2006.01)
    *H01L 33/50*     (2010.01)
    *G02B 26/00*     (2006.01)

(52) U.S. Cl.
CPC .................. *F21V 9/32* (2018.02); *F21V 9/38* (2018.02); *G03B 21/204* (2013.01); *H01L 33/502* (2013.01); *H01L 33/504* (2013.01); *C01P 2002/30* (2013.01); *C01P 2002/72* (2013.01); *C01P 2004/01* (2013.01); *C01P 2004/61* (2013.01); *C01P 2006/60* (2013.01); *G02B 26/008* (2013.01)

(56) References Cited

U.S. PATENT DOCUMENTS

2006/0284196 A1   12/2006   Setlur
2007/0257596 A1   11/2007   Shimomura

OTHER PUBLICATIONS

Anant A. Seilur et al: "Crystal Chemistry and Luminescence of Ce 3+-Doped Lu 2 CaMg 2 (Si, Ge) 3 0 12 and Its Use in LED Basedlighting",Chemistry of Materials vol. 18, No. 14, Jul. 1, 2006(Jul. 1, 2006), pp. 3314-3322, XP055662964.
Nammalwae K. Prasanth et al: "Controlling Ce3+ Emission Color in Silicate Garnet Phosphor" ECS Transaction, Jan. 1, 2009, pp. 57-64, XP055692008.
Partial Supplemental European Search Report for corresponding European Application No. 18818922.9 dated May 14, 2020.
Extended European Search Report for corresponding European Application No. 18818922.9 dated Aug. 14, 2020.
International Search Report for corresponding Application No. PCT/JP2018/018117, dated Jul. 31, 2018.

GARNET SILICATE, GARNET SILICATE PHOSPHOR, AND WAVELENGTH CONVERTER AND LIGHT EMITTING DEVICE WHICH USE THE GARNET SILICATE PHOSPHOR

TECHNICAL FIELD

The present invention relates to garnet silicate, a garnet silicate phosphor, and a wavelength converter and a light emitting device which use the garnet silicate phosphor. More specifically, the present invention relates to garnet silicate capable of becoming a phosphor usable for solid-state illumination such as light emitting diode illumination and laser illumination and for a light emitting device such as a projector, relates to a garnet silicate phosphor using the garnet silicate, and relates to a wavelength converter and a light emitting device.

BACKGROUND ART

Heretofore, there has been known a light emitting device composed by combining a solid-state light emitting element and a wavelength converter including a phosphor with each other. As such a light emitting device as described above, for example, a white light emitting diode light source, a laser illuminator and a laser projector have been known.

In such phosphors oriented for the light emitting device, $Lu_2CaMg_2(SiO_4)_3:Ce^{3+}$ is known as one of phosphors as candidates for practical use (Refer to Patent Literature 1). Note that the $Lu_2CaMg_2(SiO_4)_3:Ce^{3+}$ phosphor is also referred to as a LuCaMG phosphor in this description.

The LuCaMG phosphor is a garnet silicate phosphor in which silicate of a garnet compound represented by the general formula: $Lu_2CaMg_2(SiO_4)_3$ is activated by $Ce^{3+}$. Then, the LuCaMG phosphor has a characteristic of absorbing blue light and performing wavelength conversion for the absorbed blue light into orange light having a fluorescence peak at a vicinity of 600 nm as a wavelength.

CITATION LIST

Patent Literature

Patent Literature 1: U.S. Pat. No. 7,442,326

SUMMARY OF INVENTION

However, a particle size of the conventional LuCaMG phosphor is extremely small, and the LuCaMG phosphor is prone to become irregularly-shaped fine powder. Accordingly, for the LuCaMG phosphor, efficient wavelength conversion has been difficult. Then, since there is no LuCaMG phosphor sufficiently suitable for a light emitting device, a wavelength converter that uses the LuCaMG phosphor and is enough for practical use for the light emitting device has not been obtained. Therefore, it has been difficult to obtain a light emitting device, which emits a high-output fluorescent component having ultrashort afterglow properties, by using the LuCaMG phosphor.

The present invention has been made in consideration of such problems as described above, which are inherent in the prior art. Then, it is an object of the present invention to provide garnet silicate that has a relatively large primary particle size and is capable of obtaining a phosphor that combines high light emission efficiency and high light absorption rate with each other. It is another object of the present invention to provide a garnet silicate phosphor including the garnet silicate, and to provide a wavelength converter and a light emitting device which use the garnet silicate phosphor.

In order to solve the above-described problems, garnet silicate according to a first aspect of the present invention is garnet silicate containing, as a main component, silicate represented by a general formula: $Lu_2CaMg_2(SiO_4)_3$. The garnet silicate includes primary particles having a particle shape derived from a crystal structure of garnet. The garnet silicate contains alkaline metal including at least lithium, in which a content of the alkaline metal is less than 2000 ppm.

A garnet silicate phosphor according to a second aspect of the present invention includes garnet silicate and ions which are included in the garnet silicate and function as a light emission center.

A wavelength converter according to a third aspect of the present invention includes the garnet silicate phosphor.

A light emitting device according to a fourth aspect of the present invention includes the garnet silicate phosphor or the wavelength converter.

DESCRIPTION OF EMBODIMENTS

This embodiment will be described below with reference to the drawings. Any of embodiments to be described below illustrates a preferred example of this embodiment. Hence, numeric values, shapes, materials, components, arrangement positions and connection modes of the constituents, steps, order of the steps, and the like, which are shown in the following embodiments, are merely examples, and are not intended to limit this embodiment.

[Garnet Silicate]

Garnet silicate according to this embodiment is garnet silicate containing, as a main component, silicate represented by a general formula: $Lu_2CaMg_2(SiO_4)_3$. Then, the garnet silicate includes primary particles having a particle shape derived from a crystal structure of garnet. The garnet silicate as described above has good crystallinity, and accordingly, is excellent in monodispersity, thus making it possible to obtain a phosphor that combines high light emission efficiency and high light absorption rate with each other.

The above-mentioned "garnet silicate containing, as a main component, silicate represented by the general formula: $Lu_2CaMg_2(SiO_4)_3$," refers to silicate that consists of $Lu_2CaMg_2(SiO_4)_3$ and has a garnet-type crystal structure. Alternatively, "garnet silicate containing, as a main component, silicate represented by the general formula: $Lu_2CaMg_2(SiO_4)_3$" refers to silicate that has a garnet-type crystal structure and is a solid solution in which a solid solution ratio of $Lu_2CaMg_2(SiO_4)_3$ silicate serving as an end member is 70 mol % or more. Note that, in the garnet silicate, preferably, the solid solution ratio of the $Lu_2CaMg_2(SiO_4)_3$ silicate serving as an end member is 90 mol % or more.

When the garnet silicate of this embodiment is the solid solution containing the $Lu_2CaMg_2(SiO_4)_3$ silicate, a compound to be solid-solved with the $Lu_2CaMg_2(SiO_4)_3$ silicate is not particularly limited. The compound to be thus solid-solved also includes, for example, a virtual compound such as $Lu_2MgMg_2(SiO_4)_3$, which is estimated to actually exist as a compound. A reason for this is that a large number of examples of solid solutions each having a mode with which a compound estimated to actually exist is to be solid-solved are present as well-known to those skilled in the art.

As specific examples of the garnet silicate as the solid solution according to this embodiment, there are mentioned $(1-x)Lu_2CaMg_2(SiO_4)_3 \cdot xLu_3Al_2(AlO_4)_3$, $(1-x)Lu_2CaMg_2(SiO_4)_3 \cdot xLu_3Mg_2(SiO_4)_2(AlO_4)$, $(1-x)Lu_2CaMg_2(SiO_4)_3 \cdot xCa_3Sc_2(SiO_4)_3$, $(1-x)Lu_2CaMg_2(SiO_4)_3 \cdot xLu_2MgMg_2(SiO_4)_3$ and the like. Herein, x is preferably a numeric value that satisfies $0 \leq x < 0.3$, more preferably a numeric value that satisfies $0 \leq x < 0.1$.

The above-mentioned "particle shape derived from the crystal structure of garnet" refers to a polyhedral shape recognized in particles of major practical phosphors (for example, $Y_3Al_2(AlO_4)_3:Ce^{3+}$, $Lu_3Al_2(AlO_4)_3:Ce^{3+}$) having the garnet-type crystal structure. Moreover, "particle shape derived from the crystal structure of garnet" also includes a pseudo polyhedral shape in which corners and edges of such a relevant polyhedron are rounded. The garnet silicate of this embodiment includes at least primary particles having such a polyhedral shape or pseudo polyhedral shape as described above. The garnet silicate composed of the primary particles having the polyhedral shape or the pseudo polyhedral shape easily adopts a monodisperse particle form or a particle form similar thereto. Accordingly, the garnet silicate can become a phosphor capable of highly efficiently absorbing excitation light and emitting light. Note that, more preferably, the garnet silicate of this embodiment is mainly composed of the primary particles having such a polyhedral shape or pseudo polyhedral shape as described above.

Note that, preferably, "particle shape derived from the crystal structure of garnet" is a particle shape having a distinct facet. Such "facets" refer to flat crystal planes when viewed on the atomic scale. In general, the facets are recognized on single crystal excellent in crystal quality. Hence, as highly flat facets are recognized, single crystal particles can be regarded excellent in crystal quality.

Preferably the garnet silicate of this embodiment is powder. Then, preferably, an average particle size of the garnet silicate is 3 μm or more. Specifically, the garnet silicate is a particle group, and the average particle size of the garnet silicate is preferably 3 μm or more, more preferably 5 μm or more, particularly preferably 10 μm or more. The average particle size of the garnet silicate is 3 μm or more, whereby it becomes possible to obtain a phosphor easy to use for a light emitting device. Moreover, such garnet silicate is activated, for example, by $Ce^{3+}$, whereby it becomes possible to obtain a garnet silicate phosphor in which an absorption rate of short wavelength visible light (violet or blue light) is large.

In the garnet silicate, an upper limit of the average particle size is not particularly limited; however, is preferably less than 50 μm, more preferably less than 30 μm in a case of being suitably used as a phosphor for a light emitting device. Note that the average particle size of the garnet silicate refers to an average value of maximum axial lengths of particles when the particle group of the dispersed garnet silicate is observed by a microscope. Therefore, when the dispersed garnet silicate is a mixture of primary particles and secondary particles, the average particle size of the garnet silicate refers to an average value of a sum of maximum axial lengths of the primary particles and maximum axial lengths of the secondary particles.

The garnet silicate of this embodiment contains alkaline metal. Specifically, preferably, the garnet silicate contains at least one alkaline metal selected from the group consisting of lithium (Li), sodium (Na), potassium (K), rubidium (Rb) and cesium (Cs). However, preferably, the garnet silicate contains at least lithium. The garnet silicate contains a trace amount of the alkaline metal, and particularly lithium, whereby the particle group of the garnet silicate will include the primary particles having the particle shape derived from the crystal structure of garnet. Then, the garnet silicate becomes capable of becoming particulate in a monodispersed state while being accompanied with growth of the primary particles thereof.

A reason why such an advantageous effect is recognized is not clear. However, it is recognized that the containing of the trace amount of alkaline metal leads to the fact that the garnet silicate forms a single crystal phase. Therefore, the reason is considered to be that insertion of monovalent alkaline metal ions different in valence from $Lu^{3+}$, $Ca^{2+}$ and $Mg^{2+}$ in the garnet silicate acts so as to compensate lattice defects in the crystals of the garnet silicate with charges, resulting in acceleration of crystal growth.

In the garnet silicate of this embodiment, preferably, a content of the alkaline metal containing at least lithium is less than 2000 ppm. When the content of the alkaline metal is 2000 ppm or more, sintering between the particles of the garnet silicate is accelerated, and the particles are liable to become large aggregated particles. Then, since a phosphor composed of the large aggregated particles is difficult to highly disperse, there is a possibility that the phosphor becomes difficult to efficiently absorb the excitation light. Therefore, in order to obtain a phosphor that absorbs the excitation light highly efficiently, preferably, the content of the alkaline metal is less than 2000 ppm. Note that, in the garnet silicate, the content of the alkaline metal is more preferably less than 1500 ppm, still more preferably less than 300 ppm.

In the garnet silicate of this embodiment, the content of the alkaline metal containing at least lithium is preferably 50 ppm or more, more preferably 100 ppm or more. In this case, since the primary particles having the particle shape derived from the crystal structure of garnet increase, the garnet silicate becomes capable of becoming particulate in a monodispersed state.

In the garnet silicate, a content of lithium is preferably less than 2000 ppm, more preferably less than 1500 ppm, still more preferably less than 300 ppm. Moreover, in the garnet silicate, the content of lithium is preferably 50 ppm or more, more preferably 100 ppm or more. The content of lithium remains within this range, whereby the primary particles having the particle shape derived from the crystal structure of garnet further increase, and accordingly, it becomes possible to efficiently obtain the particles thus monodispersed.

Next, a method for producing the garnet silicate according to this embodiment will be described. The garnet silicate can be synthesized by using a conventional solid phase reaction. Specifically, the garnet silicate can be produced in accordance with Reaction formula 1.

$$Lu_2O_3+CaCO_3+2MgO+3SiO_2+xLiCl \rightarrow Lu_2CaMg_2(SiO_4)_3+xLiCl(+CO_2\uparrow)$$ [Chem. 1]

Specifically, first, as shown in Reaction formula 1, powders of raw materials such as lutetium oxide ($Lu_2O_3$), calcium carbonate ($CaCO_3$), magnesium oxide (MgO) and silicon dioxide ($SiO_2$) are prepared. Next, such raw material powders are blended so as to have a stoichiometric composition of a desired compound or a composition close to the stoichiometric composition, and are mixed thoroughly by using a mortar, a ball mill, a stirrer and the like. A method of the mixing may be either dry mixing or wet mixing if the raw material powders are sufficiently mixed. In a case of the wet mixing, ion exchange water, ethanol, isopropyl alcohol, acetone or the like can be used as a medium; however, other mediums may be used, and the medium for use is not limited.

Thereafter, such a mixed raw material is fired by an electric furnace or the like by using a firing vessel such as an alumina crucible, a platinum crucible and a magnetic crucible, whereby a fired product of the mixed raw material can be obtained. Note that, when the mixed raw material is fired, it is preferable to heat the mixed raw material at a firing temperature of 700 to 1000° C. for several hours in the atmosphere or a reducing atmosphere.

Herein, in such a production method according to this embodiment, a reaction accelerator is preferably used, and lithium chloride (LiCl) is preferably used as the reaction accelerator. Moreover, with regard to usage of the reaction accelerator, 2 to 5 moles of the reaction accelerator are preferably used with respect to 1 mol of the garnet silicate to be synthesized therewith, and 2 to 4 moles of the reaction accelerator are more preferably used. With regard to the usage of the reaction accelerator, 3 moles of the reaction accelerator are particularly preferably used with respect to 1 mol of the garnet silicate to be synthesized therewith. That is, in Reaction formula 1, x is preferably 2 to 5, x is more preferably 2 to 4, and x is particularly preferably 3.

In usual, an addition amount of the reaction accelerator in a general synthesis method at the time of synthesizing powder phosphor is several mol % to several 10 mol % with respect 1 mol of the phosphor. However, in the production method according to this embodiment, 200 mol % or more of the reaction accelerator is used with respect to the garnet silicate to be obtained. Thus, the garnet silicate will contain alkaline metal, and accordingly, it becomes possible to obtain the primary particles having the particle shape derived from the crystal structure of garnet.

In the production method of this embodiment, the fired product of the mixed raw material, which is obtained as mentioned above, and the reaction accelerator are mixed with each other, and thereafter, are finally fired, whereby the garnet silicate can be obtained. A method for mixing the fired product of the mixed raw material and the reaction accelerator with each other is not particularly limited, and for example, the mixing may be dry mixing. Moreover, in such final firing, it is preferable to heat the mixed raw material at a firing temperature of 1100 to 1400° C. for several hours in the reducing atmosphere.

Note that the method for producing the garnet silicate according to this embodiment is not limited to the method according to the above-mentioned Reaction formula 1. Therefore, garnet silicate obtained by another production method is also included in this embodiment.

As described above, the garnet silicate according to this embodiment is garnet silicate containing, as a main component, the silicate represented by the general formula: $Lu_2CaMg_2(SiO_4)_3$. Then, the garnet silicate includes the primary particles having the particle shape derived from the crystal structure of garnet. The garnet silicate further contains the alkaline metal containing at least lithium, in which the content of the alkaline metal is less than 2000 ppm. The garnet silicate of this embodiment contains the alkaline metal, and accordingly, the particle group of the garnet silicate will include the primary particles having the particle shape derived from the crystal structure of garnet. Then, the garnet silicate becomes particulate in the monodispersed state while being accompanied with the growth of the primary particles thereof. Therefore, a light emission center of the garnet silicate as described above is activated, whereby it becomes possible to obtain a garnet silicate phosphor that also has the relatively large primary particle size and combines high light emission efficiency and high light absorption rate with each other.

[Garnet Silicate Phosphor]

Next, the garnet silicate phosphor according to this embodiment will be described. The garnet silicate phosphor according to this embodiment includes garnet silicate and ions which are included in the garnet silicate and function as a light emission center. Thus, the garnet silicate phosphor is easily excited by an external stimulus, for example, application of a particle beam (α ray, β ray, electron beam) or an electromagnetic wave (γ ray, X ray, vacuum ultraviolet ray, ultraviolet ray, visible light), and becomes capable of emitting fluorescence. Note that, if the fluorescence emitted from the garnet silicate phosphor is any electromagnetic wave selected from the ultraviolet ray, the visible light and an infrared ray, then the fluorescence can be used for a light emitting device to be described later; however, preferable fluorescence in terms of practical use is the visible light. If the emitted fluorescence is the visible light, the light emitting device can be used in a wide range including a display device and an illumination device.

In the garnet silicate phosphor, the ions which function as the light emission center are not particularly limited. As the ions which function as the light emission center, for example, at least one selected from the group consisting of $ns^2$-type ions, transition metal ions and rare earth ions. Specific examples of the $ns^2$-type ions include, for example, $Sn^{2+}$, $Sb^{3+}$, $Tl^+$, $Pb^{2+}$ and $Bi^{3+}$. Specific examples of the transition metal ions include, for example, $Mn^{2+}$, $Mn^{4+}$, $Cr^{3+}$ and $Fe^{3+}$. Specific examples of the rare earth ions include, for example, $Ce^{3+}$, $Pr^{3+}$, $Nd^{3+}$, $Sm^{3+}$, $Eu^{3+}$, $Eu^{2+}$, $Gd^{3+}$, $Tb^{3+}$, $Dy^{3+}$, $Ho^{3+}$, $Er^{3+}$, $Tm^{3+}$ and $Yb^{3+}$. Such ions as described are used as the light emission center, whereby it becomes possible to obtain a garnet silicate phosphor imparted with fluorescence properties.

In the garnet silicate phosphor, preferably, the ions which function as the light emission center are $Ce^{3+}$. Thus, the garnet silicate phosphor emits orange fluorescence, and further, the orange fluorescence can include many red light components demanded much for use in the light emitting device.

Preferably, the garnet silicate phosphor of this embodiment is a $Ce^{3+}$-activated phosphor containing the garnet silicate as a base material, and the garnet silicate contains, as a main component, the silicate represented by the general formula: $Lu_2CaMg_2(SiO_4)_3$. Such a garnet silicate phosphor as described above can absorb blue light around a wavelength of 460 nm, and can perform wavelength conversion for the absorbed blue light into orange light having a fluorescence peak around a wavelength of 600 nm. Moreover, a fluorescence lifetime of $Ce^{3+}$ is $10^{-8}$ to $10^{-7}$s, and $Ce^{3+}$ has shortest ultrashort afterglow properties among the above-described ions. Therefore, even under an excitation condition of high power-density light such as high-power laser light, a high fluorescence output can be obtained, which has a reduced saturation phenomenon and is almost proportional to such an excitation light density. Therefore, $Ce^{3+}$ is used as the light emission center, whereby a phosphor suitable for high output-type LED illumination and laser illumination can be obtained.

The garnet silicate phosphor of this embodiment contains the above-mentioned garnet silicate as a base material. Therefore, the garnet silicate phosphor turns to a powder phosphor that is good in crystallinity, excellent in monodispersity, and has relatively large primary particle size. In general, the light emission efficiency of the phosphor correlates to the crystallinity thereof, and the monodispersity thereof correlates to easiness of producing the wavelength converter. Moreover, the primary particle size of the $Ce^{3+}$-activated phosphor correlates to light absorption characteristics for blue light. Therefore, the garnet silicate phosphor of this embodiment can become a phosphor that exerts advantageous effects of having high light emission efficiency, being easy to produce the wavelength converter, and being excellent in light absorption characteristics.

[Wavelength Converter]

Next, the wavelength converter according to this embodiment will be described in detail. The wavelength converter of this embodiment includes the garnet silicate phosphor. For example, the wavelength converter has functions to absorb energy emitted by a solid-state light emitting element such as a light emitting diode, and to convert the absorbed energy into visible light of which color tone is controlled. Such a wavelength converter as described above is used for the light emitting device using the solid-state light emitting element, whereby it becomes possible to control the color tone of the light emitted by the solid-state light emitting element, and to obtain desired illumination light.

FIG. 1 to FIG. 5 schematically illustrate the wavelength converter according to this embodiment. In FIG. 1 to FIG. 5, a first phosphor 1 is the garnet silicate phosphor according to this embodiment. A second phosphor 2 is a phosphor different in composition or crystal structure from the garnet silicate phosphor according to this embodiment.

Figure 1:
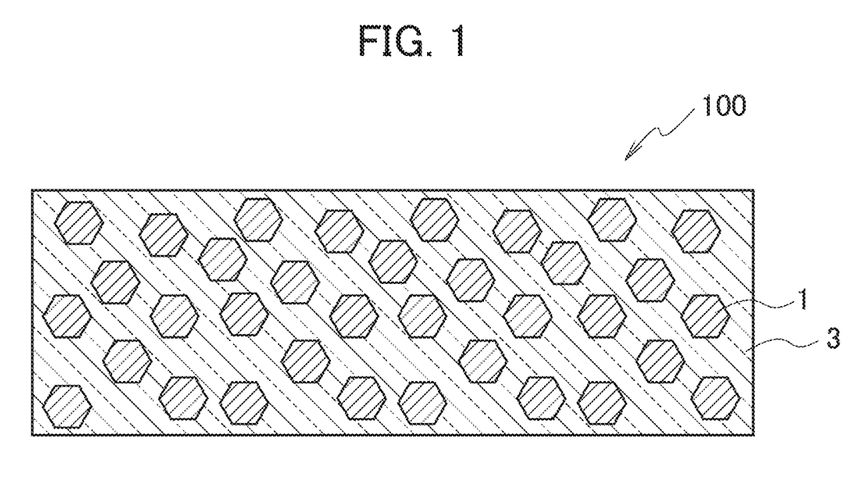
FIG. 1 is a schematic cross-sectional view illustrating an example of a wavelength converter according to an embodiment of the present invention.
Figure 2:
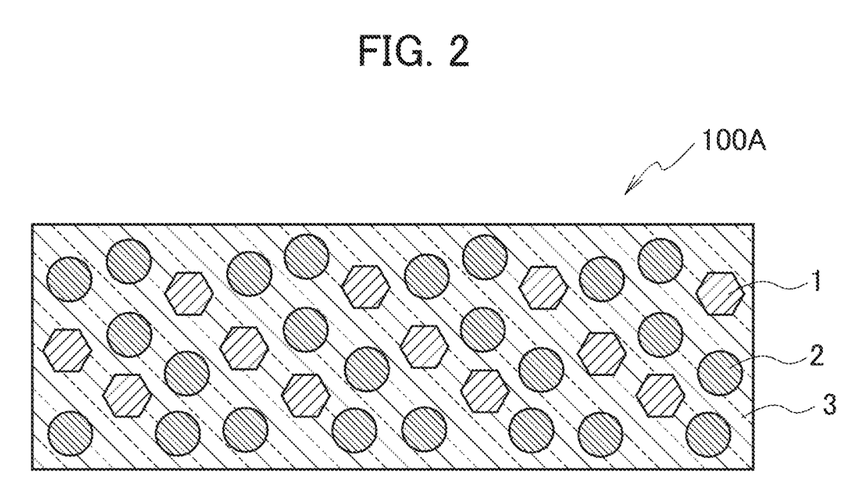
FIG. 2 is a schematic cross-sectional view illustrating another example of the wavelength converter according to the embodiment of the present invention.

As illustrated in FIG. 1, a wavelength converter 100 according to this embodiment can be configured so that the first phosphor 1 is dispersed inside a sealing body 3. Moreover, as illustrated in FIG. 2, a wavelength converter 100A can be configured so that the first phosphor 1 and the second phosphor 2 are dispersed inside the sealing body 3. The sealing body 3 is a sealant that seals the phosphor particles, and at least one of an inorganic material and an organic material can be used. As such an inorganic material as described above, for example, there can be mentioned a transparent inorganic material such as low-melting-point glass. Moreover, as such an organic material, for example, a transparent organic material such as a silicone resin can be used. When the inorganic material is used as the sealing body 3, a wavelength converter entirely composed of an inorganic substance can be formed, and accordingly, a wavelength converter excellent in thermal conductivity and advantageous in terms of heat dissipation can be obtained. Meanwhile, when the organic material is used as the sealing body 3, a wavelength converter in which phosphors are dispersed in a resin can be obtained. Such a wavelength converter as described above can be produced easily by a well-known method.

Figure 3:
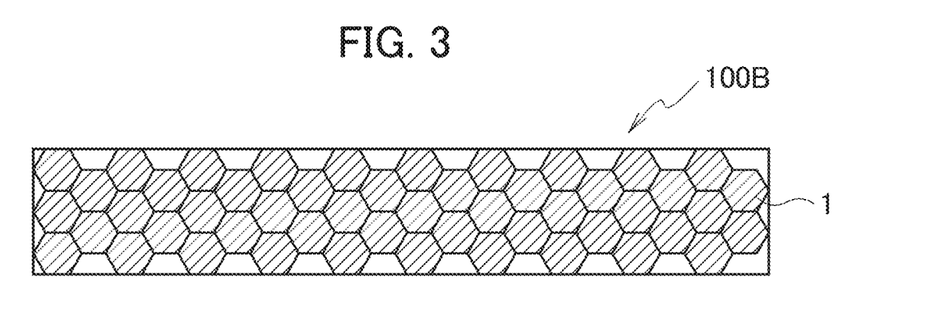
FIG. 3 is a schematic cross-sectional view illustrating still another example of the wavelength converter according to the embodiment of the present invention.
Figure 4:
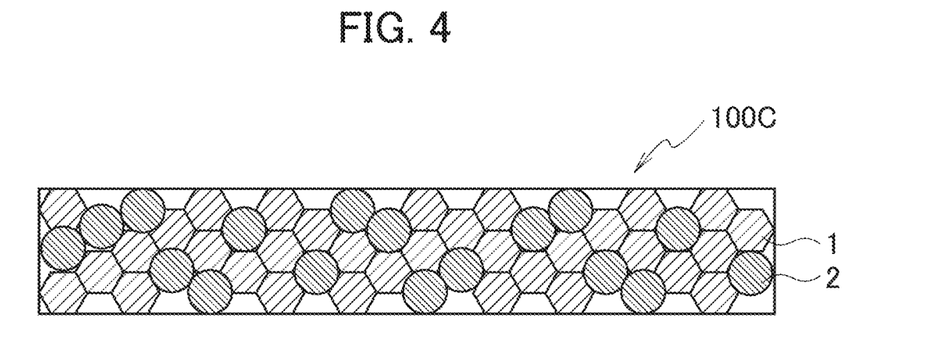
FIG. 4 is a schematic cross-sectional view illustrating yet another example of the wavelength converter according to the embodiment of the present invention.

Note that, as illustrated in FIG. 3 and FIG. 4, the wavelength converter of this embodiment can also be formed as a wavelength converter that does not use the sealing body 3. In this case, particles of the phosphors just need to be adhered to one another by using an organic or inorganic binding agent. Moreover, the particles of the phosphors can also be adhered to one another by using a heating reaction between particles of the first phosphor 1 or a heating reaction between the first phosphor 1 and the second phosphor 2. As the binding agent, there can be used a resin-based adhesive used commonly, or ceramic fine particles, low-melting-point glass or the like. The wavelength converter that does not use the sealing body 3 can be thinned in thickness, and accordingly, suitably used for the light emitting device.

A wavelength converter 100B illustrated in FIG. 3 is a wavelength converter in which the particles of the first phosphor 1 are adhered to one another, or a wavelength converter in which the particles of the phosphor 1 are bonded to one another by the binding agent. A wavelength converter 100C illustrated in FIG. 4 is a wavelength converter in which the particles of the first phosphor 1 and the second phosphor 2 are adhered to one another, or a wavelength converter in which the particles of the phosphor 1 and the second phosphor 2 are bonded to one another by the binding agent.

Figure 5:
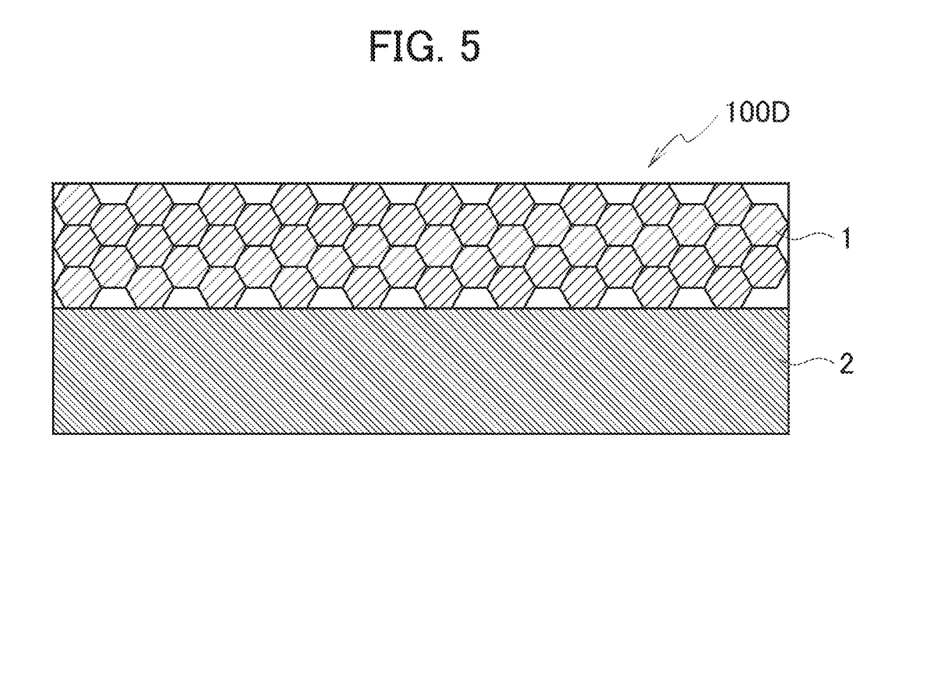
FIG. 5 is a schematic cross-sectional view illustrating still another example of the wavelength converter according to the embodiment of the present invention.

As illustrated in FIG. 5, a wavelength converter 100D of this embodiment can also be configured to have a structure in which a particle group of the first phosphor 1 is adhered to a surface of such a plate-shaped second phosphor 2 without using the sealing body 3. In this case, as the plate-shaped second phosphor 2, there can be used a sintered body in which a plurality of phosphor particles are sintered and a plurality of air gaps are provided in an inside. Moreover, as the second phosphor 2, there can be used a ceramic body in which a plurality of phosphor particles are sintered and a plurality of air gaps are not provided in an inside.

The first phosphor is not limited to one type. As long as the first phosphor 1 is the garnet silicate phosphor according to this embodiment, the first phosphor 1 may be a phosphor in which a plurality of types of phosphors different in particle size, particle shape and composition are appropriately combined with one another. Moreover, the second phosphor 2 is not limited to one type, either, and may be a phosphor in which a plurality of types of the second phosphors different in composition, crystal structure, particle size, particle shape, nature or form are appropriately combined with one another.

In the wavelength converter of this embodiment, it is preferable that the first phosphor 1 and the second phosphor 2 emit fluorescences different in emission color from each other. Thus, types and content ratios of the first phosphor 1 and the second phosphor 2 are appropriately changed, whereby the wavelength converter that emits output light of which color tone is controlled can be obtained.

In the wavelength converter of this embodiment, it is preferable that a phosphor usable as the second phosphor 2 be at least one selected from the group consisting of an oxide-based phosphor, a sulfide-based phosphor, a nitride-based phosphor and a halide-based phosphor. Such a preferable phosphor as the second phosphor 2 is the oxide-based phosphor easy to handle in the atmosphere and at a normal pressure. It is preferable that the second phosphor 2 be at least one selected from the group consisting of oxide, silicate, aluminate, phosphate, borate, halo-silicate, halo-aluminate and halo-phosphate. Such phosphors as described above are easy to produce industrially, and accordingly, can be used particularly suitably.

As the oxide-based phosphor, for example, there can be mentioned: a garnet phosphor activated by $Ce^{3+}$, such as $Y_3Al_2(AlO_4)_3:Ce^{3+}$, $Ca_3Sc_2(SiO_4)_3:Ce^{3+}$ and $Lu_2CaMg_2(SiO_4)_3:Ce^{3+}$; a calcium ferrite-type phosphor activated by $Ce^{3+}$, such as $MSc_2O_4:Ce^{3+}$ and $MLu_2O_4:Ce^{3+}$; and an oxyfluoride phosphor activated by $Ce^{3+}$, such as $M_3AlO_4F:Ce^{3+}$. Herein, M is at least one element selected from Ca, Sr and Ba.

As the sulfide-based phosphor, for example, there can be mentioned phosphors of $Ce^{3+}$-activated alkaline earth metal sulfide and thiogallate, such as $MS:Ce^{3+}$ and $MGa_2S_4:Ce^{3+}$. Herein, M is at least one element selected from Ca, Sr and Ba.

As the nitride-based phosphor, for example, there can be mentioned a phosphor selected from that of $Ce^{3+}$-activated oxynitride alumino nitride silicate, nitride silicate, oxynitride silicate and nitride alumino silicate such as $LaAl(Si,Al)_6(N,O)_{10}:Ce^{3+}$, $LaSi_3N_5:Ce^{3+}$, $Ca\text{-}\alpha\text{-sialon}:Ce^{3+}$, $CaAlSiN_3:Ce^{3+}$ and $La_3Si_6Ni:Ce^{3+}$.

It is preferable that a crystal structure of the phosphor usable as the second phosphor 2 be of a garnet type, a perovskite type, an apatite type, a $K_2NiF_4$ type, an olivine type, an A rare earth type, a B rare earth type, a C rare earth type, a spinel type, a celite type or a calcium ferrite type. Note that, preferably, the crystal structure is a structure that has many compounds which function as base materials of a highly efficient phosphor. Therefore, it is more preferable that the crystal structure of the phosphor usable as the second phosphor 2 be of the perovskite type, the apatite type, the $K_2NiF_4$ type, the garnet type, the olivine type, the spinel type, or the calcium ferrite type.

As specific examples of the oxide having the garnet-type crystal structure, there are mentioned: $Ca_3Sc_2(SiO_4)_3$ and $Lu_2CaMg_2(SiO_4)_3$ as silicate that serves as an end member; $Y_3Mg_2(SiO_4)_2(AlO_4)$, $Y_3MgAl(AlO_4)_2(SiO_4)$, $Lu_3Mg_2(SiO_4)_2(AlO_4)$, $Y_2BaAl_2(AlO_4)_2(SiO_4)$, $Y_2MgAl_2(AlO_4)_2(SiO_4)$, $Y_2CaAl_2(AlO_4)_2(SiO_4)$, $Lu_2CaAl_2(AlO_4)_2(SiO_4)$ and $Ca_3Zr_2(AlO_4)_2(SiO_4)$ as aluminosilicate that serves as an end member; $Lu_3Al_2(AlO_4)_3$, $Y_3Al_2(AlO_4)_3$, $Gd_3Al_2(AlO_4)_3$, $Tb_3Al_2(AlO_4)_3$, $Y_3Ga_2(AlO_4)_3$, $Y_3SC_2(AlO_4)_3Ca_2YZr_2(AlO_4)_3$, $Ca_2EuZr_2(AlO_4)_3$, $Ca_2GdZr_2(AlO_4)_3$, $Ca_2TbZr_2(AlO_4)_3$, $Ca_2LuZr_2(AlO_4)_3$, $Ca_2YHf_2(AlO_4)_3$ as aluminate that serves as an end member; and the like. In this embodiment, there can be used such phosphors in which the light emission center is added to these compounds each of which serves as a base material.

A shape of the wavelength converter of this embodiment is not particularly limited. Preferably, the wavelength converter has a thin plate shape, and also preferably, has a disc shape or a rectangular plate shape. The wavelength converter having such a shape becomes easy to produce and handle.

A size of the wavelength converter is not particularly limited, either. In the wavelength converter, a maximum lateral length on a cross section thereof is preferably 0.1 mm or more and less than 100 mm, more preferably 1 mm or more and less than 30 mm. Moreover, a minimum lateral length on the cross section of the wavelength converter is also preferably 0.1 mm or more and less than 100 mm, more preferably 1 mm or more and less than 30 mm. A thickness of the wavelength converter is preferably 30 μm or more and less than 1 cm, more preferably 50 μm or more and less than 3 mm.

Preferably, the wavelength converter has a size equivalent to a projected area larger than a spot diameter of the laser light (generally, several 10 μm or more and less than 5 mm). In this case, it becomes possible to irradiate the wavelength converter with all the laser light, and accordingly, efficient wavelength conversion is enabled.

As illustrated in FIG. 1 to FIG. 5, the wavelength converter according to this embodiment is composed by using the above-mentioned garnet silicate phosphor, and particularly, the $Ce3^+$-activated garnet silicate phosphor. The garnet silicate phosphor according to this embodiment has advantageous effects of being easy to produce and excellent in light absorption characteristics. Therefore, by using the garnet silicate phosphor, a wavelength converter suitable for use in a light emitting device can be obtained. Moreover, the $Ce^{3+}$-activated garnet silicate phosphor is used, whereby a wavelength converter that emits a high-output warm color light component having ultrashort afterglow properties can be obtained.

Note that the wavelength converter according to this embodiment is not limited to those illustrated in FIG. 1 to FIG. 5, and a variety of modifications other than these can be adopted.

[Light Emitting Device]

Next, a light emitting device according to this embodiment will be described. The light emitting device of this embodiment includes the above-mentioned garnet silicate phosphor or wavelength converter.

The light emitting device of this embodiment widely includes electronic devices provided with functions to emit light, and is not particularly limited as long as is an electronic device that emits any kind of light. Moreover, the light emitting device also includes an illumination light source, an illuminator, a display device and the like. Therefore, an illuminator, a projector or the like, which is provided with a laser diode, is also regarded as a light emitting device.

The light emitting device of this embodiment is a device that uses at least the above-mentioned garnet silicate phosphor or wavelength converter, and further uses, as output light, the fluorescence emitted by this garnet silicate phosphor or wavelength converter. Specifically, the light emitting device of this embodiment combines the above-mentioned garnet silicate phosphor or wavelength converter and an excitation source that excites this garnet silicate phosphor or wavelength converter with each other. Then, the garnet silicate phosphor absorbs energy emitted by the excitation source, and convert the absorbed energy into fluorescence of which color tone is controlled.

Figure 6:
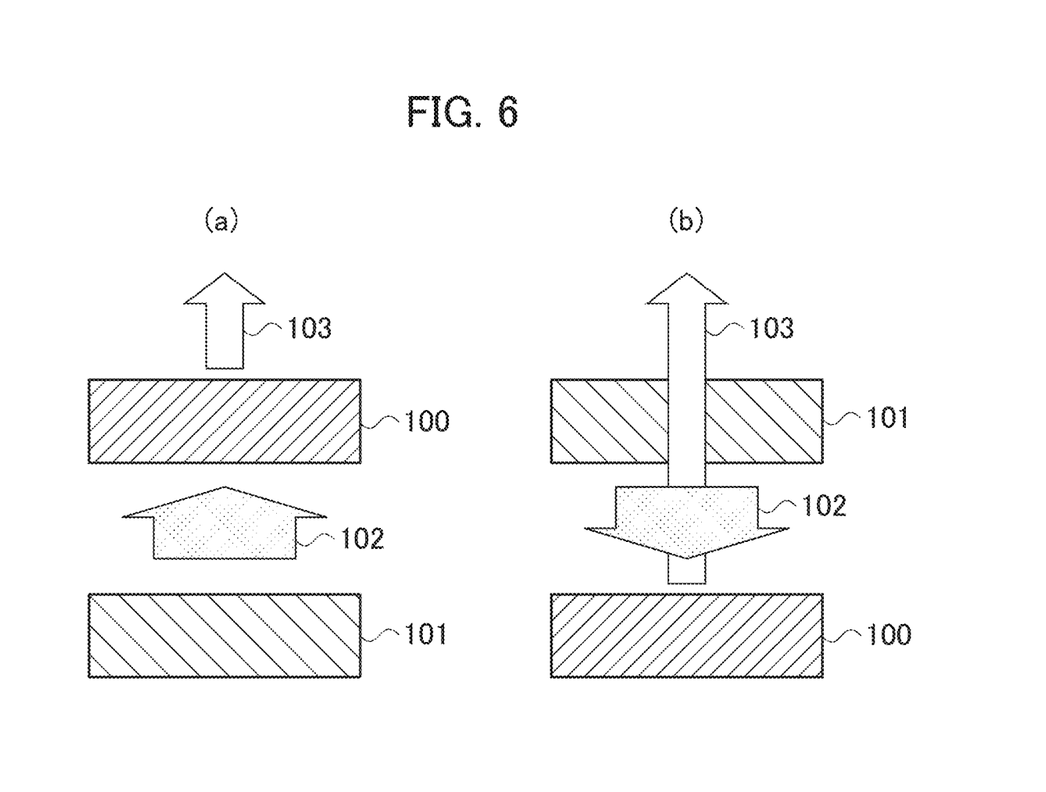
FIG. 6 is schematic views for explaining a light emitting device according to the embodiment of the present invention.

Hereinafter, the light emitting device of this embodiment will be described with reference to the drawings. FIG. 6 illustrates an outline of the light emitting device according to this embodiment. In FIG. 6(a) and FIG. 6(b), an excitation source 101 is a light source that generates excitation light 102 for exciting the phosphors provided in the wavelength converter 100 of this embodiment. As the excitation source 101, a radiation device can be used, which radiates a particle beam (an α ray, a β ray, an electron beam or the like) or an electromagnetic wave (a γ ray, an X ray, a vacuum ultraviolet ray, an ultraviolet ray, visible light or the like). Note that, as the excitation source 101, it is preferable to use a radiation device that radiates short wavelength visible light that is violet light or blue light.

As the excitation source 101, there can be used varieties of radiation generating devices, electron beam radiating devices, discharge light generating devices, solid-state light emitting elements, solid-state light emitting devices, and the like. Typical ones of the excitation source 101 include an electron gun, an X-ray tube, a rare gas discharge device, a mercury discharge device, a light emitting diode, a laser beam generating device including a semiconductor laser, an inorganic or organic electroluminescence element, and the like.

In FIG. 6(a) and FIG. 6(b), output light 103 is an excitation line emitted by the excitation source 101, or fluorescence emitted by the phosphors in the wavelength converter 100, which are excited by the excitation light 102. Then, the output light 103 is used as illumination light or display light in the light emitting device.

FIG. 6(a) illustrates a light emitting device that has a structure in which the output light 103 from the wavelength converter 100 is emitted in a direction where the wavelength converter 100 is irradiated with the excitation line or the excitation light 102. Note that, as the light emitting device illustrated in FIG. 6(a), a fluorescent lamp, an electron tube and the like are mentioned as well as a white LED light source and a transmission-type laser illuminator. Meanwhile, FIG. 6(b) illustrates a light emitting device that has a structure in which the output light 103 from the wavelength converter 100 is emitted in a reverse direction to the direction where the wavelength converter 100 is irradiated with the excitation line or the excitation light 102. As the light emitting device illustrated in FIG. 6(b), there are mentioned reflection-type laser illuminators, for example, a light source device, a projector and the like, each of which uses a reflective plate-attached phosphor wheel.

Preferable ones as specific examples of the light emitting device of this embodiment are a semiconductor light emitting device, an illumination light source, an illuminator, a display device and the like, each of which uses the phosphors, and particularly, are laser illumination and a laser projector.

Then, it is preferable that the light emitting device of this embodiment further include the solid-state light emitting element, and that the garnet silicate phosphor or the wavelength converter convert the excitation light emitted by the solid-state light emitting element into light having a longer wavelength than the excitation light. Moreover, it is preferable that the solid-state light emitting element emit the short wavelength visible light. Use of the solid-state light emitting element as the excitation source makes it possible to achieve an all-solid-state light emitting device resistant to impact, for example, solid-state illumination. Note that the light emitting device as described above can be suitably used for any purpose of outdoor illumination, store illumination, a dimming system, facility illumination, ocean illumination, a projector, and an endoscope.

As described above, the light emitting device according to this embodiment includes the garnet silicate phosphor or the wavelength converter. The garnet silicate phosphor of this embodiment is provided with a particle size, a shape and nature, which are preferable in terms of the production of the light emitting device. Therefore, in this way, it becomes possible to obtain a light emitting device that is easy to manufacture, and further, emits a high-output warm color light component having ultrashort afterglow properties.

It is preferable that the light emitting device according to this embodiment further include, as the excitation source, a light emitting element that emits blue light having a peak within a wavelength range of 440 nm or more and less than 475 nm, and that the blue light excites the garnet silicate phosphor. Thus, by additive color mixture of the blue light and the warm color light emitted by the garnet silicate phosphor, a light emitting device that emits white-based light can be obtained.

Note that, preferably, in the light emitting device, such a fluorescent component emitted by the garnet silicate phosphor is used as illumination light or display pixels. Thus, a light emitting device usable as an illuminator or a display device can be obtained.

EXAMPLES

Hereinafter, this embodiment will be described more in detail by Example, Comparative example and Reference examples; however, this embodiment is not limited to Example.

Garnet silicate phosphors according to Example, Comparative example and Reference examples were synthesized by using a preparation method that utilizes a solid phase reaction, and characteristics thereof were evaluated. Note that, in Example, Comparative example and Reference examples, the following compound powders were used as main raw materials.

Lutetium cerium oxide (($Lu_{0.97}Ce_{0.03})_2O_3$): purity 3N, made by Nippon Yttrium Co., Ltd.

Calcium carbonate ($CaCO_3$): purity 2N5, made by Kanto Chemical Co., Inc.

Magnesium oxide (MgO): purity 3N, made by Wako Pure Chemical Industries, Ltd.

Silicon dioxide ($SiO_2$): purity>3N, made by Nippon Aerosil Co., Ltd.

Note that, in Example and Reference examples, the following compound powder was used as a reaction accelerator.

Lithium chloride (LiCl): purity 2N, made by Wako Pure Chemical Industries, Ltd.

In Example, Comparative example and Reference examples, a target garnet silicate phosphor was set to "$(Lu_{0.97}Ce_{0.03})_2CaMg_2(SiO_4)_3$".

Example

In Example, the garnet silicate phosphor was attempted to be synthesized in accordance with Reaction formula 2. Note that, as seen from Reaction formula 2, Example is a synthesis method using 3 moles of the reaction accelerator (LiCl) with respect to 1 mol of the garnet silicate phosphor ($Lu_2CaMg_2(SiO_4)_3:Ce^{3+}$) to be synthesized.

$(Lu,Ce)_2O_3 + CaCO_3 + 2MgO + 3SiO_2 + 3LiCl \rightarrow$
$(Lu,Ce)_2CaMg_2(SiO_4)_3 + 3LiCl(+CO_2\uparrow)$    [Chem. 2]

In Example, the main raw materials of the phosphor were weighed in ratios shown in Table 1. Next, these raw materials were put into a beaker into which 100 ml of pure water was poured, and were subjected to wet mixing by using a stirrer. Then, slurry after being subjected to the wet mixing was dried by a dryer, and a firing raw material was obtained. Thereafter, the firing raw material was transferred to an alumina crucible, and was fired for 2 hours in an atmosphere of 900° C. The reaction accelerator in a ratio shown in Table 1 was added to a fired product thus obtained, and thereafter, a resultant was subjected to dry mixing by using a mortar and a pestle.

Mixed powder thus prepared was finally fired for 1 hour in a reducing atmosphere (in an atmosphere of 96 vol % of nitrogen and 4 vol % of hydrogen) at 1350° C. by a tubular atmosphere furnace, whereby a fired product of the phosphor of Example was synthesized. Note that both of a temperature rise rate and a temperature drop rate at the time of such final firing were set to 400° C./hour.

TABLE 1

|  | Main raw material | | | | Reaction accelerator |
| --- | --- | --- | --- | --- | --- |
|  | $(Lu_{0.97}Ce_{0.03})_2O_3$ | $CaCO_3$ | $MgO$ | $SiO_2$ | $LiCl$ |
| Example | 1.979 g | 0.501 g | 0.403 g | 0.923 g | 0.636 g |
| Comparative example | 1.979 g | 0.501 g | 0.403 g | 0.923 g | — |
| Reference example 1 | 1.979 g | 0.501 g | 0.403 g | 0.923 g | 0.021 g |
| Reference example 2 | 1.979 g | 0.501 g | 0.403 g | 0.923 g | 0.064 g |
| Reference example 3 | 1.979 g | 0.501 g | 0.403 g | 0.923 g | 0.212 g |
| Reference example 4 | 1.979 g | 0.501 g | 0.403 g | 0.923 g | 2.120 g |

The fired product of the phosphor, which was thus synthesized, was added with pure water, and was disintegrated by using a ball mill. Thereafter, the fired product of the phosphor was classified by a water screen using a sieve (250 mesh), followed by drying, whereby the garnet silicate phosphor of Example was obtained. Note that the garnet silicate phosphor of Example was a vivid orange fired product.

Comparative Example

In Comparative example, the garnet silicate phosphor was attempted to be synthesized in accordance with Reaction formula 3 by using a conventional solid phase reaction using no flux. Specifically, the garnet silicate phosphor of Comparative example was obtained in a similar procedure to that of Example except that the reaction accelerator was not added. Note that the garnet silicate phosphor of Comparative example was a pale orange fired product.

$(Lu,Ce)_2O_3 + CaCO_3 + 2MgO + 3SiO_2 \rightarrow (Lu,Ce)_2CaMg_2(SiO_4)_3(+CO_2\uparrow)$ [Chem. 3]

Reference Examples

In each Reference example, the garnet silicate phosphor was attempted to be synthesized in accordance with Reaction formula 4. x in Reaction formula 4 is a numeric value selected from 0.1, 0.3, 1 and 10. Then, x in Reference example 1, Reference example 2, Reference example 3 and Reference example 4 are respectively 0.1, 0.3, 1 and 10.

$(Lu,Ce)_2O_3 + CaCO_3 + 2MgO + 3SiO_2 + xLiCl \rightarrow (Lu,Ce)_2CaMg_2(SiO_4)_3 + xLiCl(+CO_2\uparrow)$ [Chem. 4]

The garnet silicate phosphors of Reference examples 1 to 4 were synthesized similarly to Example 1 except that the addition amount of the reaction accelerator was adjusted to amounts shown in Table 1. Note that the garnet silicate phosphors of Reference examples 1 to 3 were pale orange fired products like Comparative example. Meanwhile, the garnet silicate phosphor of Reference example 4 was a deep orange fired product.

As seen from Reaction formula 4, Reference examples 1 to 3 are synthesis methods using 0.1 mol or more and 1 mol or less of the reaction accelerator with respect to 1 mol of the garnet silicate phosphor to be synthesized. Moreover, Reference example 4 is a synthesis method using 10 moles of the reaction accelerator with respect to 1 mol of the garnet silicate phosphor to be synthesized.

Herein, the addition amount of the reaction accelerator in the general synthesis method at the time of synthesizing the powder phosphor is several mol % to several 10 mol % with respect 1 mol of the phosphor. Therefore, Reference example 1 and Reference example 2 are conventional synthesis methods of the silicate phosphor, each of which selects LiCl as the reaction accelerator. Meanwhile, Reference example 3 and Reference example 4 are special synthesis methods of selecting LiCl as the reaction accelerator, and then using a large amount of the reaction accelerator.

[Evaluation]

The garnet silicate phosphors of Example, Comparative example and Reference examples 1 to 4, which were obtained as mentioned above, were subjected to observation using an electron microscope, crystal structure analysis, and light emission spectrum measurement. Moreover, contents of metal impurities were measured for the garnet silicate phosphors of Example and Comparative example.

(Electron Microscopy)

Figure 7:
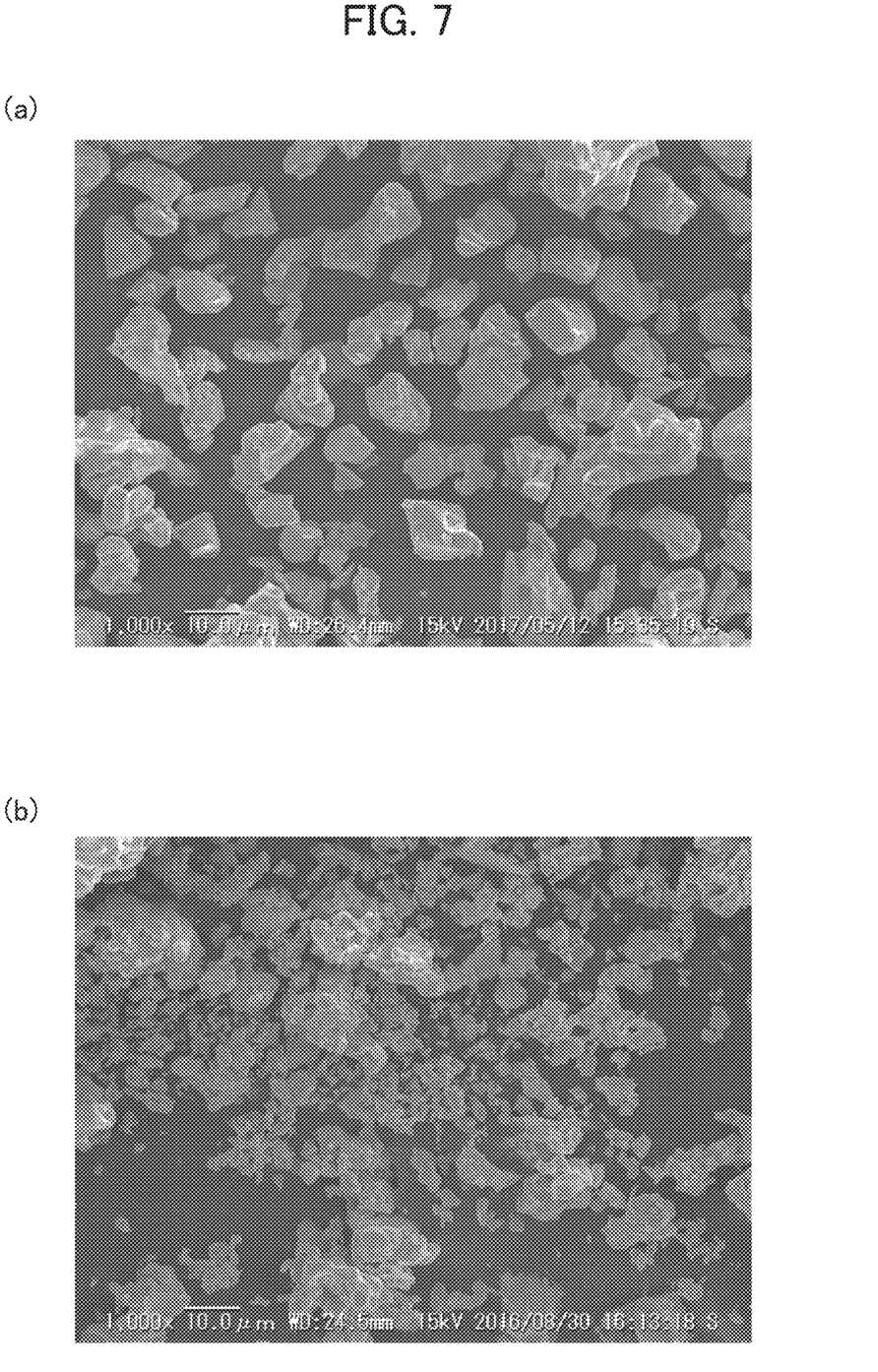
FIG. 7(a) is an electron micrograph showing a $Lu_2CaMg_2(SiO_4)_3:Ce^{3+}$ phosphor according to Example.
FIG. 7(b) is an electron micrograph showing a $Lu_2CaMg_2(SiO_4)_3:Ce^{3+}$ phosphor according to a comparative example.

The garnet silicate phosphors of Example, Comparative example and Reference examples were observed by using an electron microscope (product name: VE-9800, made by Keyence Corporation). FIG. 7(a) shows an observation result of the garnet silicate phosphor of Example, and FIG. 7(b) shows an observation result of the garnet silicate phosphor of Comparative example.

As illustrated in FIG. 7(b), a primary particle size of the garnet silicate phosphor of Comparative example was mainly 1 μm to 3 μm. In contrast, as illustrated in FIG. 7(a), a primary particle size of the garnet silicate phosphor of Example was mainly 3 μm to 15 μm. From this, it is seen that the primary particle size of the garnet silicate phosphor of Example is larger by several times than that of the garnet silicate phosphor of Comparative example.

Moreover, as illustrated in FIG. 7(b), the garnet silicate phosphor of Comparative example includes a relatively large number of irregular primary particles, in which many forms of aggregated particles composed by aggregation of small primary particles are recognized. Then, in the garnet silicate phosphor of Comparative example, the primary particles having the particle shape derived from the crystal structure of garnet were not able to be found.

In contrast, as illustrated in FIG. 7(a), the garnet silicate phosphor of Example 1 includes a relatively large number of primary particles having a shape close to a rhombic dodecahedron as crystal habit of a garnet compound, in which many particle forms close to monodispersed particles are recognized. That is, in the garnet silicate phosphor of Example, a large number of the primary particles having the particle shape derived from the crystal structure of garnet were able to be found.

Figure 8:
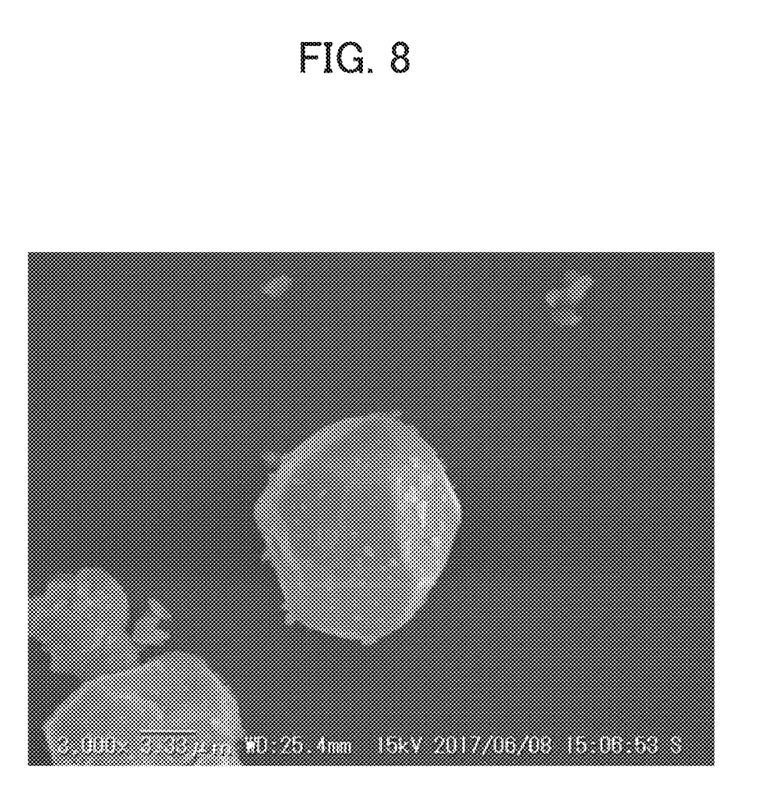
FIG. 8 is an electron micrograph enlargedly showing the $Lu_2CaMg_2(SiO_4)_3:Ce^{3+}$ phosphor according to Example.

FIG. 8 shows an example of the particles included in the particle group of the garnet silicate phosphor of Example. The garnet silicate phosphor shown in FIG. 8 was monodispersed particles composed of the primary particles derived from the crystal structure of garnet, and had a particle size of approximately 13 µm. Moreover, from FIG. 8, it is seen that the garnet silicate phosphor of Example has facets derived from the crystal structure of garnet.

Figure 9:
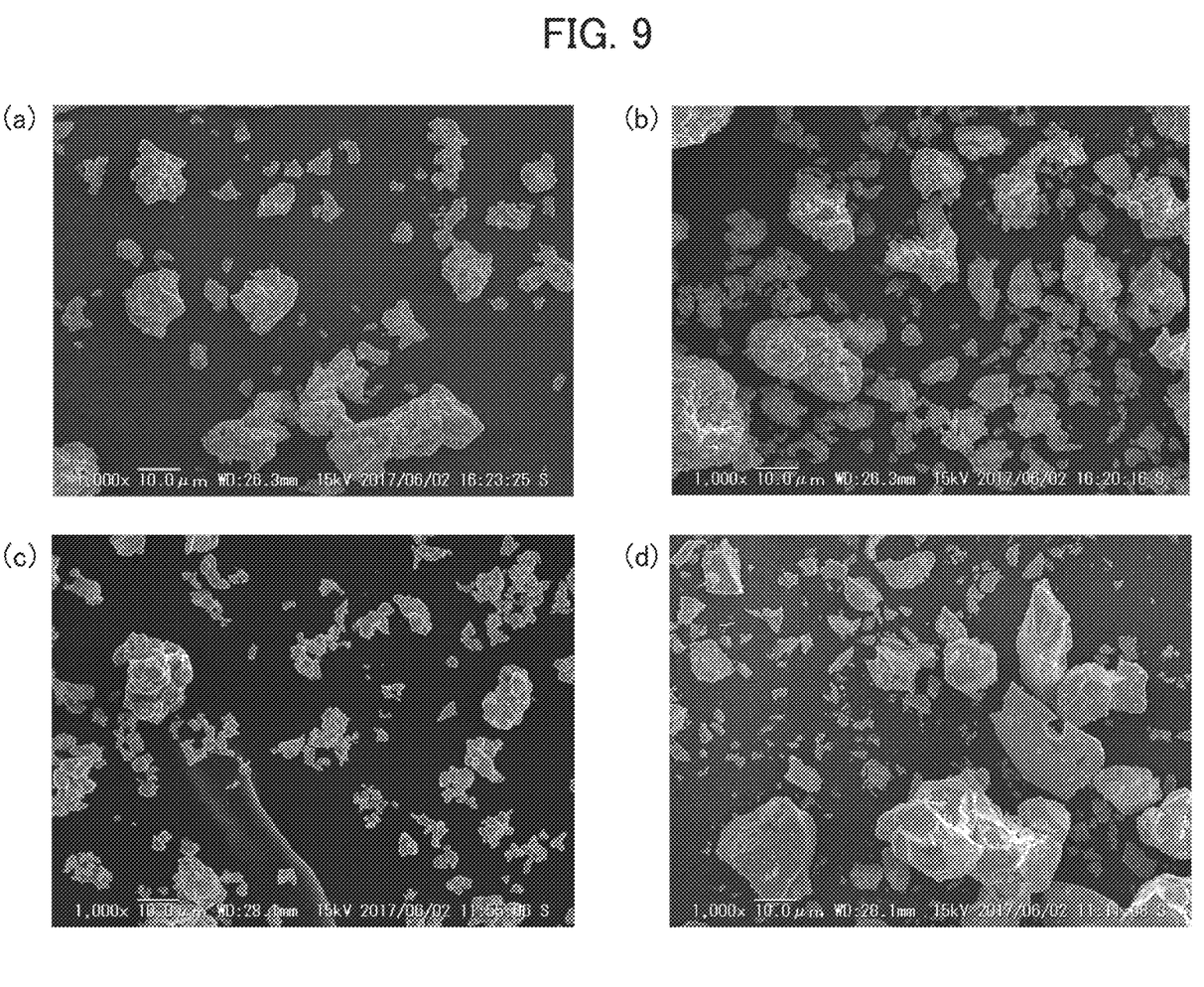
FIG. 9(a) is an electron micrograph showing a $Lu_2CaMg_2(SiO_4)_3:Ce^{3+}$ phosphor according to Reference example 1.
FIG. 9(b) is an electron micrograph showing a $Lu_2CaMg_2(SiO_4)_3:Ce^{3+}$ phosphor according to Reference example 2.
FIG. 9(c) is an electron micrograph showing a $Lu_2CaMg_2(SiO_4)_3:Ce^{3+}$ phosphor according to Reference example 3.
FIG. 9(d) is an electron micrograph showing a $Lu_2CaMg_2(SiO_4)_3:Ce^{3+}$ phosphor according to Reference example 4.

FIG. 9(a) shows an observation result of the garnet silicate phosphor of Reference example 1. FIG. 9(b) shows an observation result of the garnet silicate phosphor of Reference example 2. FIG. 9(c) shows an observation result of the garnet silicate phosphor of Reference example 3. FIG. 9(d) shows an observation result of the garnet silicate phosphor of Reference example 4.

As seen from comparison between FIGS. 9(a) to 9(c) according to Reference examples 1 to 3 and FIG. 7(b) according to Comparative example, the garnet silicate phosphors each of which used 1 mol (100 mol %) or less of LiCl with respect to 1 mol of the garnet silicate phosphor exhibited results that the obtained particles did not have much difference therebetween. That is, as results, the obtained particles included a relatively large number of irregular primary particles, in which many forms of aggregated particles composed by aggregation of small primary particles were recognized. Moreover, in the garnet silicate phosphors of Reference examples 1 to 3, the primary particles having the particle shape derived from the crystal structure of garnet were not able to be found.

Meanwhile, as seen from FIG. 9(d), in the synthesis method using 10 moles of LiCl with respect to 1 mol of the garnet silicate phosphor, the obtained garnet silicate phosphor caused intense sintering between the particles, and became large aggregates. Moreover, in the garnet silicate phosphor of Reference example 4, the primary particles having the particle shape derived from the crystal structure of garnet were not able to be found. Therefore, it was unexpected that, when LiCl was selected as the reaction accelerator, and an addition amount thereof was made specific, the particle group of the $Lu_2CaMg_2(SiO_4)_3:Ce^{3+}$ phosphor in the form suitable for the light emitting device was generated.

(Crystal Structure Analysis)

Figure 10:
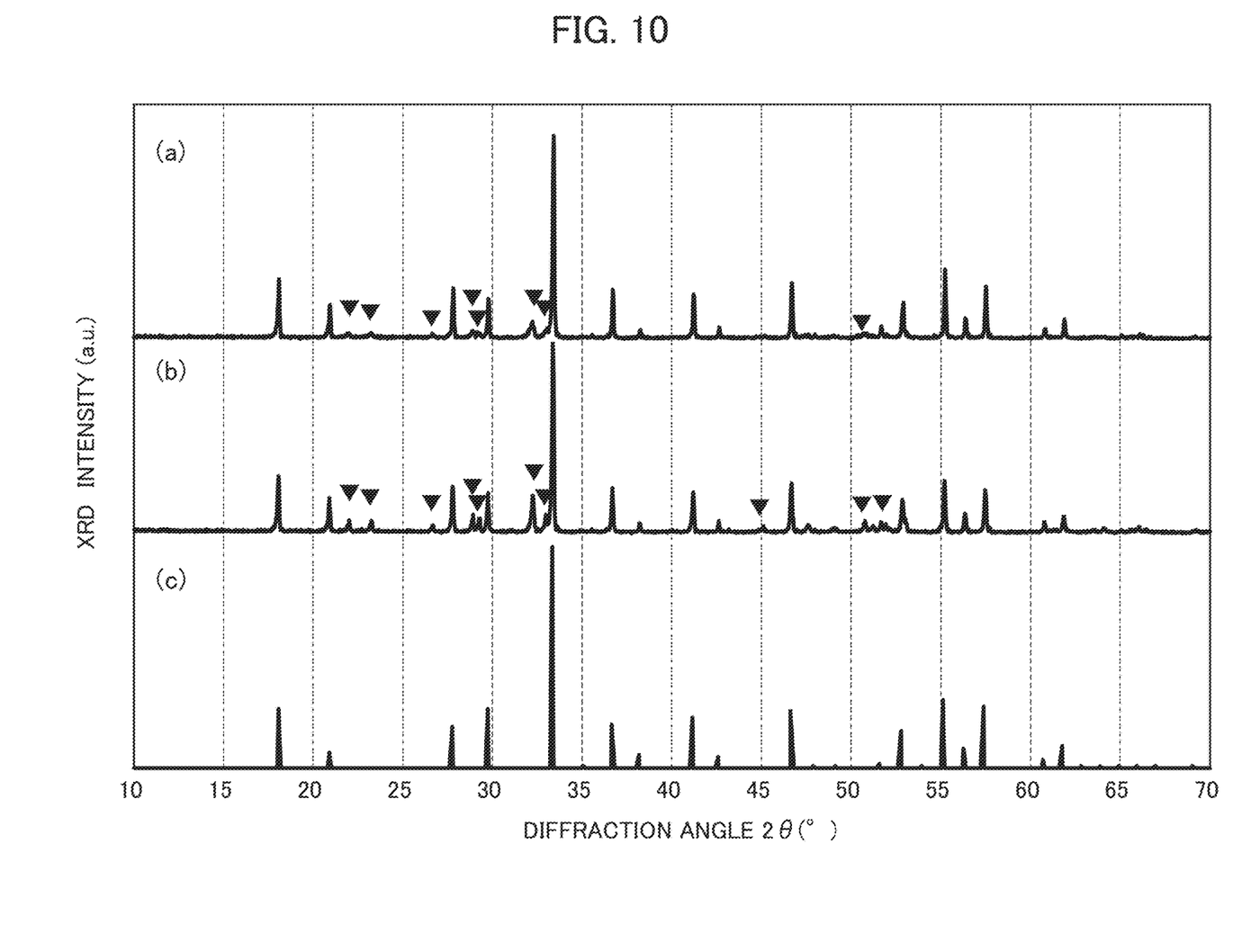
FIG. 10 is a graph illustrating a result of measuring X-ray diffraction patterns of the phosphor according to Example and the phosphor according to Comparative example.

Crystal structure analysis of the garnet silicate phosphors of Example and Comparative example was performed using an X-ray diffractometer (product name: MultiFlex, made by Rigaku Corporation). FIG. 10(a) shows a measurement result of the garnet silicate phosphor of Example. Moreover, FIG. 10(b) shows a measurement result of the garnet silicate phosphor of Comparative example. For reference, FIG. 10(c) shows a pattern (PDF No. 330040) of $Y_3Al_5O_{12}$ registered in the Power Diffraction Files (PDF) and having a garnet-type crystal structure.

As seen from comparison between (a) and (c) of FIG. 10, an X-ray diffraction pattern of the phosphor of Example was mainly a pattern similar to $Y_3Al_5O_{12}$ having the garnet-type crystal structure. This fact indicates that the phosphor of Example is mainly composed of a compound having a garnet-type structure.

Herein, attention is paid to diffraction peaks which are found to some extent in FIGS. 10(a) and 10(b) and are different from those of $Y_3Al_5O_{12}$ have the garnet-type crystal structure. Note that diffraction peaks different from those of $Y_3Al_5O_{12}$ are denoted by "▼" in FIG. 10. Intensities of the diffraction peaks different from those of $Y_3Al_5O_{12}$ were smaller in Example shown in FIG. 10(a) than Comparative example shown in FIG. 10(b). This fact indicates that a mixed amount of different compounds was smaller in the phosphor of Example than in the phosphor of Comparative example. Then, as a result of comparison with Comparative example, it can be said that the garnet silicate phosphor of Example is rare earth garnet silicate relatively close to a single crystal phase.

Note that, though data are omitted, as a result of performing crystal structure analysis for the garnet silicate phosphors of Reference examples 1 to 4, the garnet silicate phosphors exhibited X-ray diffraction patterns similar to that of Example.

(Measurement of Light Emission Spectrum)

Next, a light emission spectrum when the garnet silicate phosphor of Example was excited by blue light was evaluated using an instant multi-photometry system (product name: QE-1100, made by Otsuka Electronics Co., Ltd.). Note that an excitation wavelength when the light emission spectrum was measured was set to 450 nm. A measurement result of the light emission spectrum of Example is indicated as (a) in FIG. 11. Moreover, (b) in FIG. 11 is a light emission spectrum of the garnet silicate phosphor of Comparative example, which was measured similarly.

Figure 11:
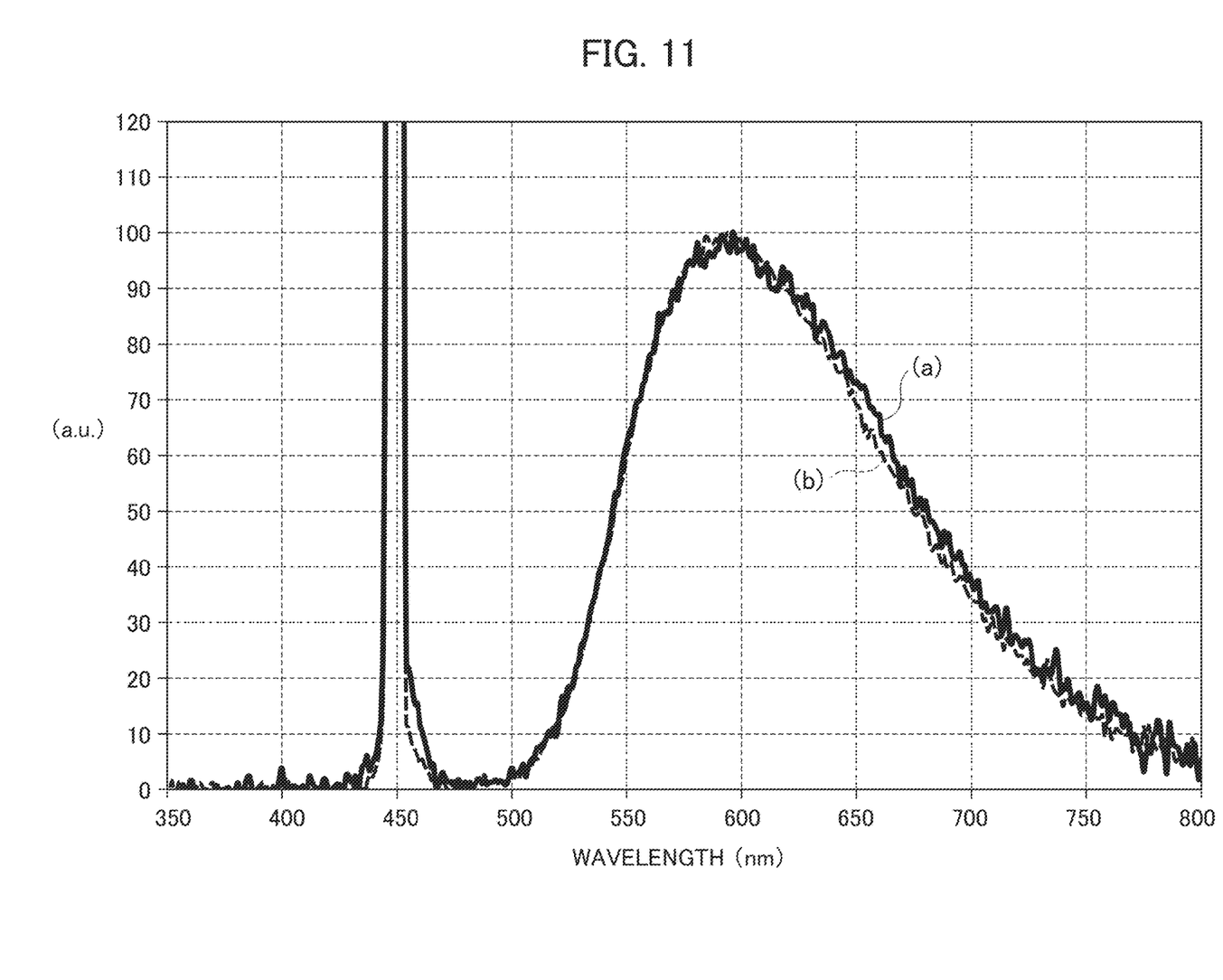
FIG. 11 is a graph illustrating a result of measuring light emission spectra of the phosphor according to Example and the phosphor according to Comparative example.

As seen from FIG. 11, in the light emission spectrum of the garnet silicate phosphor of Example, a light emission peak wavelength thereof was present in the vicinity of 596 nm, and the light emission spectrum had a broad fluorescent component by $Ce^{3+}$. In the light emission spectrum of the garnet silicate phosphor of Comparative example, a light emission peak wavelength thereof was present in the vicinity of 594 nm, and it was found that the light emission peak wavelengths of Example and Comparative example were shifted from each other to some extent. Although details are unknown, for example, a reason for this is considered as follows. In the garnet silicate phosphor of Example, an effective $Ce^{3+}$ activation volume increases, and the light emission peak wavelength shifts to a longer side due to an increase of a self-absorption effect of $Ce^{3+}$.

Note that, though data are omitted, as a result of measuring light emission spectra for the garnet silicate phosphors of Reference examples 1 to 4, the garnet silicate phosphors light emission spectra similar to that of Example.

(Metal Impurity Analysis)

Next, metal impurities in the garnet silicate phosphors of Example and Comparative example were evaluated using an inductively coupled plasma atomic emission spectrometer (product name: CIROS-120, made by Spectro GmbH). Note that, in the analysis, dried samples were subjected to alkaline melting by sodium peroxide, obtained melts were dissolved by hydrochloric acid, were thereafter diluted by pure water, and were served for the analysis. As a result of such metal impurity analysis, lithium was detected from the garnet silicate phosphor of Example. In contrast, lithium was not detected from the garnet silicate phosphor of Comparative example.

Although variations were found among the samples with regard to the content of lithium in the garnet silicate phosphor of Example, the content remained within a range from approximately 0.02 mass % (200 ppm) to approximately 0.14 mass % (1400 ppm). Therefore, when the variations and measurement errors among the samples are considered, it can be inferred that similar functions and effects to those of Example are obtained when lithium within a maximum range from 0.03 mass % (300 ppm) to 0.2 mass % (2000 ppm) is contained.

Note that as a result of the inductively coupled plasma atomic emission spectrometry, a large difference was not found between atomic ratios of main metal components (Lu, Ca, Mg and Si) constituting the crystals of Example and Comparative example. Although a detailed mechanism is unknown, when this is considered, there is a possibility that the Li component included in Example has participated in the increase of the primary particle size of the garnet silicate phosphor and the single crystal phase formation thereof. For example, it is conceived that monovalent lithium ions act so as to perform charge compensation for lattice defects in the crystals, resulting in acceleration of crystal growth.

As described above, the garnet silicate phosphor of Example combines, with one another, the primary particle shape close to the shape derived from the crystal structure of garnet, the particle form that is monodispersed or close thereto, and further, the relatively large primary particle size. These features have not been present before. Then, the garnet silicate phosphor of Example is the $Lu_2CaMg_2(SiO_4)_3:Ce^{3+}$ phosphor as a particle group that combines high light emission efficiency and high light absorption rate.

Note that the addition amount of the reaction accelerator in the general synthesis method at the time of synthesizing powder phosphor is several mol % to several 10 mol % with respect 1 mol of the phosphor. Therefore, the synthesis method of Example, which uses the reaction accelerator of which amount is as large as 300 mol % with respect to 1 mol of the phosphor, can be said to be a special synthesis method that cannot be easily conceived as a synthesis method of the powdery phosphor with a particle size of 3 μm to 20 μm.

Although this embodiment has been described above by Example and Comparative example, this embodiment is not limited to these, and various modifications are possible within the scope of the spirit of this embodiment.

The entire contents of Japanese Patent Application No. 2017-117619 (filed on: Jun. 15, 2017) are incorporated herein by reference.

INDUSTRIAL APPLICABILITY

In accordance with the present invention, there can be provided the garnet silicate capable of obtaining the phosphor that is provided with the relatively large primary particle size and combines high light emission efficiency and high light absorption rate with each other, the garnet silicate phosphor composed of the garnet silicate, and the wavelength converter and the light emitting device.

REFERENCE SIGNS LIST

1 First phosphor (garnet silicate phosphor)
100, 100A, 100B, 100C, 100D Wavelength converter

The invention claimed is:

1. Garnet silicate containing, as a main component, silicate represented by a general formula: $Lu_2CaMg_2(SiO_4)_3$, comprising:
   primary particles having a particle shape derived from a crystal structure of garnet,
   wherein the garnet silicate contains alkaline metal including at least lithium, in which a content of the alkaline metal is less than 2000 ppm.

2. The garnet silicate according to claim 1, wherein an average particle size is 3 μm or more.

3. A garnet silicate phosphor comprising:
   the garnet silicate according to claim 1; and
   ions which are included in the garnet silicate and function as a light emission center.

4. The garnet silicate phosphor according to claim 3, wherein the ions are $Ce^{3+}$.

5. A wavelength converter comprising the garnet silicate phosphor according to claim 3.

6. A light emitting device comprising the garnet silicate phosphor according to claim 3.

7. The light emitting device according to claim 6, further comprising:
   as an excitation source, a light emitting element that emits blue light having a peak within a wavelength range of 440 nm or more and less than 475 nm,
   wherein the blue light excites the garnet silicate phosphor.

8. The light emitting device according to claim 6, wherein a fluorescent component emitted by the garnet silicate phosphor is used as illumination light or a display pixel.

* * * * *